United States Patent
Morishige

(10) Patent No.: US 6,333,130 B1
(45) Date of Patent: Dec. 25, 2001

(54) METHOD AND APPARATUS FOR CORRECTING DEFECTS IN PHOTOMASK

(75) Inventor: Yukio Morishige, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/577,348

(22) Filed: May 24, 2000

Related U.S. Application Data

(62) Division of application No. 08/848,743, filed on May 1, 1997, now Pat. No. 6,136,096.

(30) Foreign Application Priority Data

May 1, 1996 (JP) .................................................. 8-134351

(51) Int. Cl.[7] .................................................. G03F 9/00
(52) U.S. Cl. .................................................. 430/5
(58) Field of Search ............... 430/5, 322; 118/725, 118/722; 427/586, 582; 382/144

(56) References Cited

U.S. PATENT DOCUMENTS

| | | | |
|---|---|---|---|
| 4,368,230 | 1/1983 | Mizukami et al. | 428/203 |
| 4,440,841 | 4/1984 | Tabuchi | 430/5 |
| 4,463,073 | 7/1984 | Miyauchi et al. | 430/5 |
| 4,609,566 | 9/1986 | Hongo et al. | 427/53.1 |
| 4,727,234 | 2/1988 | Oprysko et al. | 219/121 L |
| 4,778,693 | 10/1988 | Drozdowizcz et al. | 427/53.1 |
| 4,806,321 | 2/1989 | Nishizawa et al. | 422/245 |
| 4,975,252 | 12/1990 | Nishizawa et al. | 422/245 |
| 5,014,646 | 5/1991 | Ito et al. | 118/725 |
| 5,077,100 | 12/1991 | Miracky | 427/53.1 |
| 5,130,172 * | 7/1992 | Hicks et al. | 427/252 |
| 5,276,012 | 1/1994 | Ushida et al. | 505/1 |
| 5,292,418 | 3/1994 | Morita et al. | 204/224 R |
| 5,322,988 | 6/1994 | Russell et al. | 219/121.69 |
| 5,472,507 | 12/1995 | Yamaguchi et al. | 118/722 |
| 5,705,235 | 1/1998 | Lehmann et al. | 427/586 |
| 5,780,187 * | 7/1998 | Pierrat | 430/5 |
| 5,885,735 | 3/1999 | Imai et al. | 430/5 |
| 5,928,817 * | 7/1999 | Yan et al. | 430/5 |

FOREIGN PATENT DOCUMENTS 1-24236   5/1989   (JP) .

* cited by examiner

Primary Examiner—S. Rosasco
(74) Attorney, Agent, or Firm—Sughrue Mion, PLLC

(57) ABSTRACT

$Cr(CO)_6$ gas is fed into a chamber, in which a photomask substrate having any clear defect resulting from partial loss of a light-shielding film to fill the inside of the chamber with a $Cr(CO)_6$ gas atmosphere. By irradiating with a laser beam the clear defect of the photomask substrate in the $Cr(CO)_6$ gas atmosphere, the $Cr(CO)_6$ gas is decomposed to form a Cr film over the clear defect. Tetrakis dimethylamino titanium gas (TDMAT) is fed into the chamber to switch the atmosphere in the chamber to a TDMAT gas atmosphere. By irradiating with a laser beam the area of the photomask substrate, arranged in the TDMAT gas atmosphere, where the Cr film has been formed, the TDMAT gas is decomposed to form a TiN film, whose reflectance is smaller than that of the Cr film, over the Cr film.

12 Claims, 4 Drawing Sheets

METHOD AND APPARATUS FOR CORRECTING DEFECTS IN PHOTOMASK

This is a divisional of application Ser. No. 08/848,743, filed May 1, 1997, U.S. Pat. No. 6,136,096 the disclosure of which is incorporated herein by reference.

BACKGROUND OF THE INVENTION

1. Field of the Invention

The present invention relates to a method and an apparatus for correcting defects in a photomask, and more particularly to a method and an apparatus for correcting so-called clear defects in a photomask, which are defects formed by the loss of the light-shielding film of the photomask used in the manufacture of semiconductors or of liquid crystal displays.

2. Description of the Related Art

Conventional methods to correct clear defects in a photomask include a method to form a light-shielding film over clear defective parts of the photomask, which is disclosed in the Japanese Patent Laid-open No. 1989-124236. According to this conventional correcting method, a photomask is placed in an input gas atmosphere, and the input gas is locally decomposed on the photomask by irradiating the clear defective parts of the photomask with a laser beam to form a light-shielding film over the clear defective parts. In order to satisfy the requirements of tight adhesion to the substrate and light-shielding, both essential for a photomask, a metallic film of Cr or the like is deposited by laser chemical vapor deposition (CVD). This conventional correcting process uses as input gas a mixture of chrome carbonyl gas $(Cr(CO)_6)$ and argon gas, resulting in the formation of a film excelling in light-shielding and adhesion to the substrate.

Since this conventional clear defect correcting method for photomasks involves deposition of only a metallic light-shielding film over the substrate to correct clear defects, the reflectance of the light-shielding film deposited over the defective area is as high as about 40%. As a result, when the photomask is to be checked for any defect on the basis of the intensities of scatterred and reflected light from the substrate, the effect of light reflected from this light-shielding film having a high reflectance causes the previously defective parts already corrected by the deposition of the light-shielding film to be mistaken for uncorrected defects. At every step of inspection, these parts mistaken for defects have to be confirmed not to be defective, leading to a serious problem in the management of photomask manufacturing.

SUMMARY OF THE INVENTION

An object of the present invention is to provide a method and an apparatus for correcting defects in a photomask, capable of preventing defects which have been corrected by the deposition of a light-shielding film from being erroneously detected as uncorrected defects.

Another object of the invention is to provide a method and an apparatus for correcting defects in a photomask, capable of readily reducing the reflectance of previously defective parts corrected by the deposition of a light-shielding film.

In order to achieve the above-stated objects, a photomask defect correcting method according to the invention includes the deposition of a metallic first film so as to cover defective parts on a substrate where a light-shielding film has been lost, and then the deposition of a second film, whose reflectance is smaller than that of said first film, so as to cover the first film.

Another photomask defect correcting method according to the invention includes the deposition of a new metallic light-shielding film so as to cover defective parts on a substrate where a previous light-shielding film has been lost, and then the oxidation of the surface of said metallic light-shielding film to reduce the reflectance of its surface.

Furthermore, in order to achieve the above-stated objects, a photomask defect correcting apparatus is provided with a first gas feeding section for feeding organometallic input gas into a vessel in which a substrate is arranged; a second gas feeding section for feeding tetrakis dimethylamino titanium gas into the vessel in which said substrate is arranged; and a laser beam source for irradiating with a laser beam any desired position of the substrate arranged in said vessel when the atmosphere in said vessel consists of said input gas or said tetrakis dimethylamino titanium gas. Said second gas feeding section feeds tetrakis dimethylamino titanium gas into said vessel after the inside of said vessel is filled with said input gas atmosphere by the feeding of said input gas from said first gas feeding section and a metallic film is formed over said substrate by the irradiation of said substrate in said input gas atmosphere with a laser beam supplied from said laser beam source.

Another photomask defect correcting apparatus is provided with a first gas feeding section for feeding organometallic input gas into a vessel in which a substrate is arranged; a second gas feeding section for feeding ozone gas into the vessel in which said substrate is arranged; and a laser beam source for irradiating with a laser beam any desired position of the substrate arranged in said vessel when the atmosphere in said vessel consists of said input gas or said ozone gas. Said second gas feeding section feeds ozone gas into said vessel after the inside of said vessel is filled with said input gas atmosphere by the feeding of said input gas from said first gas feeding section and a metallic film is formed by the irradiation of said substrate in said input gas atmosphere with a laser beam supplied from said laser beam source.

BRIEF DESCRIPTION OF THE DRAWINGS

The above-mentioned and other objects, features and advnatages of the present invention will become more apparent from the following detailed description when taken in conjunction with the accompanying drawings, wherein.

DETAILED DESCRIPTION OF THE PREFERRED EMBODIMENTS

A photomask defect correcting method in accordance with the first embodiment of the present invention will be described in detail below with reference to drawings.

According to the correcting method in this embodiment, a light-shielding film is formed so as to cover the defective parts of a photomask, and then a low reflectance film is formed so as to cover the light-shielding film. In this manner, when any defective part is detected according to the intensity of reflected light from the photomask, any previously defective part which has been corrected by the deposition of the light-shielding film can be prevented from being mistaken for a still defective part.

Figure 1:
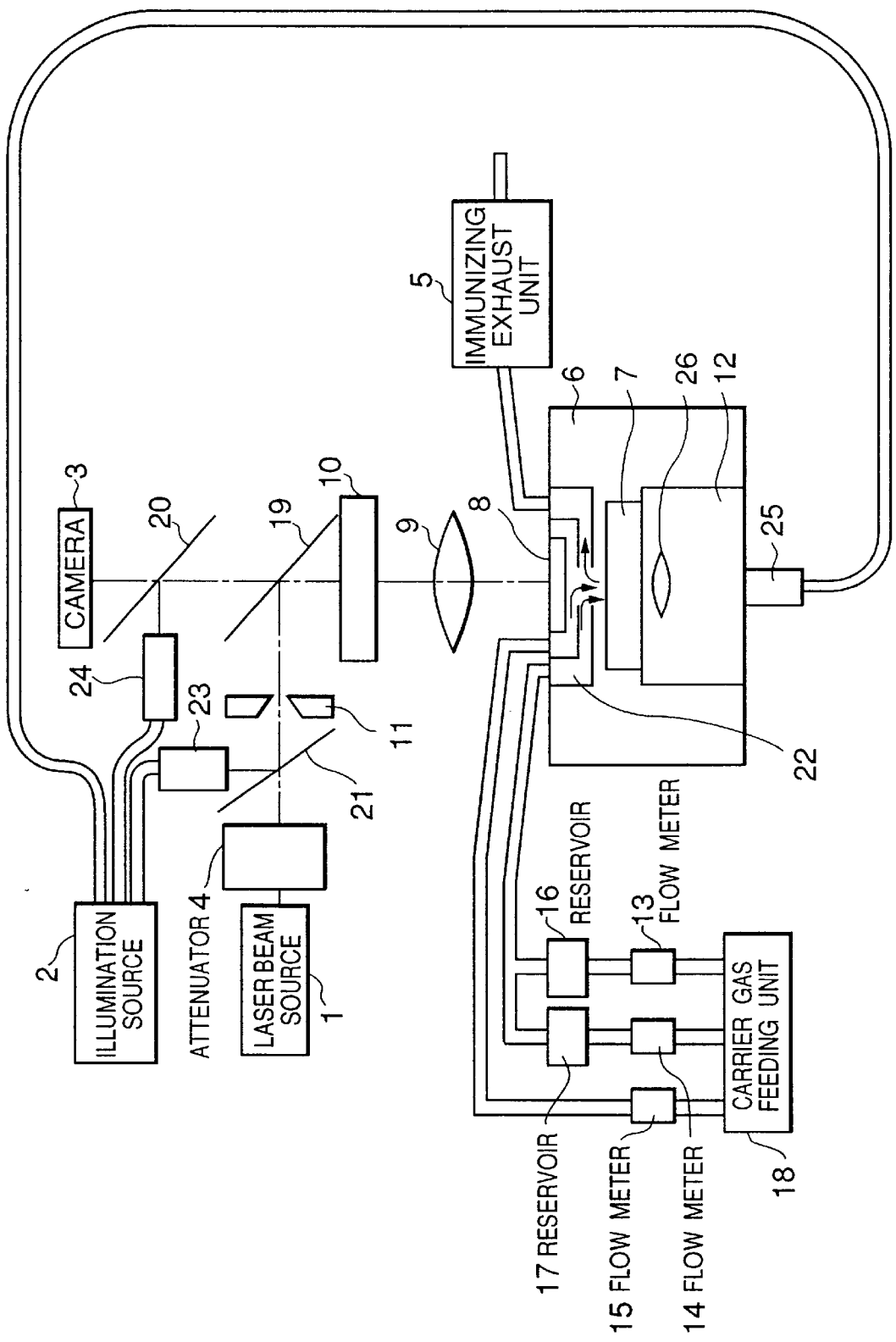
FIG. 1 is a schematic diagram illustrating the configuration of an apparatus for implementing a photomask defect correcting method in accordance with the first and second embodiments of the present invention.

Referring to FIG. 1, the substrate 7 of a photomask is arranged over an X-Y stage 12 in a chamber 6. $Cr(CO)_6$, which is an organometallic input gas 32, generated from an input gas reservoir 16, and tetrakis dimethylamino titanium (TDMAT), which is another input gas 34, generated from another input gas reservoir 17, are led by argon gas which is fed from a carrier gas feeding unit 18 to serve as carrier gas, into the chamber 6 through an input gas feeding nozzle 22. The flow rates of the input gases 32 and 34 are respectively controlled by a flow meter 13, arranged upstream from the input gas reservoir 16, and another flow meter 14, arranged upstream from the input gas reservoir 17. To the chamber 6 is also connected, in order to prevent a window 8 from being fouled by the decomposition of the input gases, piping for feeding purge gas to the window 8 while controlling its flow rate with a third flow meter 15. To the chamber 6 is further connected, as its exhaust system, an immunizing exhaust unit 5 for decomposing and trapping used input gases.

An irradiating optical system for irradiation with a laser beam and observation of the processing section is provided with the following units. A laser beam source 1, which is a fourth harmonic light source of a Q-switching Nd:YAG laser, generates a highly repetitive pulse laser beam of 266 nm in wavelength, 2 kHz in repetition frequency and 60 nm in pulse width. The beam emitted from the laser beam source 1, after being attenuated to a desired intensity by an attenuator 4, undergoes shaping of the irradiation pattern by a slit 11, passes a half mirror 19, a relay lens 10, an object glass 9 and the window 8 in that order, and irradiates the substrate 7. On the other hand, illuminating light from an illumination source 2 is branched to three optical fibers, and the branched light rays are converted into parallel beams by collimator lenses 23, 24 and 25, respectively, to be emitted as white light.

The light emitted from the collimator lens 25 is condensed by a condenser lens 26, positioned at the center of the X-Y stage 12, and irradiates the substrate 7 of the photomask from underneath. The light emitted from this collimator lens 25 to irradiate the substrate 7 is used for evaluating the light-shielding performance of the photomask. The light emitted from the collimator lens 23 is synthesized with the path of the laser beam by the action of a half mirror 21, and irradiates the substrate 7. The light emitted from this collimator lens 23 is used for observing the pattern of the irradiation of the substrate 7 with the laser beam. The light emitted from the collimator lens 24 is used for illuminating the laser beam-irradiated part and its surroundings of the substrate 7 as the actions of half mirrors 20 and 19 synthesize the optical path of a camera 3 for observation and that of the laser beam irradiation system.

Next will be described in detail the procedure of correcting clear defects with reference to FIGS. 2A, 2B and 3.

After the substrate 7 having parts where the light-shielding film of the photomask is removed, i.e. clear defects, is positioned over the X-Y stage 12, air inside the chamber 6 is removed by the immunizing exhaust unit 5 (S101). In order to prevent the window 8 from being fouled by the decomposition of the input gases, the inside of the chamber 6 is purged with argon gas supplied through piping connected to the third flow meter 15 (S102). The flow rate of argon gas to prevent the fouling of the window 8 is regulated to 700 sccm by the flow meter 15. Then the input gas reservoir 16 is opened and, with the flow rate of the flow meter 13 being regulated to 500 standard cubic centimeters per minute (sccm), feeding of the input gas 32 ($Cr(CO)_6$) is started (S103). The exhaust volume of the immunizing exhaust unit 5 is automatically controlled to substantially equalize the pressure in the chamber 6 to the atmospheric pressure.

In a state where the input gas ($Cr(CO)_6$) 32 is being supplied, the X-Y stage 12 is moved while the substrate 7 is watched with the illuminating light from the collimator lens 23 so that the target clear defect on the substrate 7 of the photomask, positioned over the X-Y stage 12, be set in the position to be irradiated with the laser beam supplied from the laser beam source 1 (S104). The size and rotating angle of the slit 11 are adjusted to the shape of the clear defect so that the clear defect can be irradiated with a laser beam of the desired size (S105).

Figure 2A:
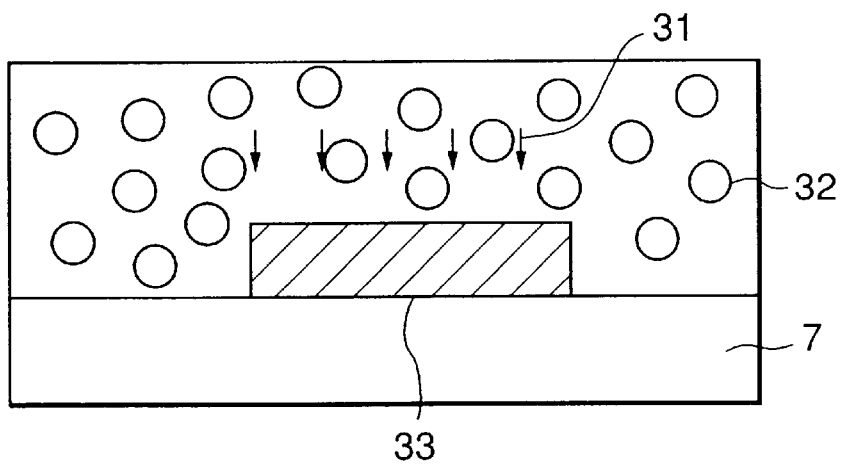
FIGS. 2A and 2B are diagrams illustrating processes for forming a metallic film and an antireflective film on a substrate in the first embodiment of the present invention.

Then, as shown in FIG. 2A, after the positioning of the clear defect relative to the targeting of irradiation with the laser beam (S104) and the adjustment of the shape of the irradiating laser beam (S105), a laser beam 31 emitted from the laser beam source 1 irradiates the clear defect on the substrate 7 for 3 seconds at an irradiation intensity of 800 $kW/cm^2$ (S106). The irradiation of the clear defective part with the laser beam 31 results in the formation of a smooth-surfaced metallic film, i.e. a Cr film 33, in a thickness of 1000 angstroms over the clear defective part (S107). This Cr film 33 constitutes the light-shielding film to correct the clear defect.

Next, when the Cr film 33 is formed over the clear defect and the clear defect is collected, the supply of the input gas ($Cr(CO)_6$) 32 is stopped. After the input gas reservoir 16 is closed to stop the supply of the input gas ($Cr(CO)_6$) 32 (S108), the other input gas reservoir 17 is opened, and the input gas (TDMAT) 34 begins to be fed into the chamber 6, with the flow rate of the flow meter 14 being regulated to 500 sccm (S109). Here, as both input gases ($Cr(CO)_6$) 32 and (TDMAT) 34 are reducing gases, they are not reactive to each other. Therefore, when the input gas (TDMAT) 34 is fed into the chamber 6, any remaining input gas ($Cr(CO)_6$) 32 in the chamber 6 would cause no trouble. As the input gases 32 and 34 are injected into the chamber 6 by the input gas feeding nozzle 22, the atmosphere around the position where irradiation with the laser beam takes place is quickly switched, within 30 seconds, from the input gas ($Cr(CO)_6$) 32 to the input gas (TDMAT) 34 by the regulation of the input gas reservoirs 16 and 17 and the flow meters 13 and 14.

Figure 2B:
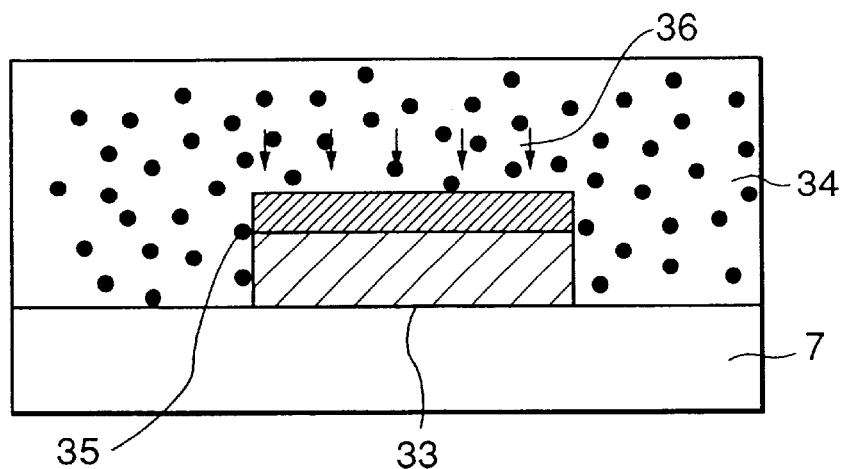

After the atmosphere around the position where irradiation with the laser beam takes place is switched to the input gas (TDMAT) 34, as shown in FIG. 2B, a laser beam 36 emitted from the laser beam source 1 irradiates the already formed Cr film 33 for 2 seconds at an irradiation intensity of 400 $kW/cm^2$ (S110). The irradiation of the Cr film 33 with the laser beam 36 results in the formation of a TiN film 35 in a thickness of 400 angstroms over the Cr film 33 (S111).

The TiN film 35 formed over the Cr film 33 is dense and smooth. Furthermore, as the TiN film 35 closely adheres to the Cr film 33, a sufficient degree of adhesion is achieved between the TiN film 35 and the Cr film 33 for the substrate 7 to be effectively used as photomask.

As the reflectance of the Cr film deposited on the substrate is as high as about 40%, a defect detecting apparatus which detects any detective part according to the intensity of light reflected from the substrate is highly likely to mistake a previously defective part, which should have been corrected by the deposition of the Cr film over it, for an uncorrected defect. As the reflectance of the TiN film deposited so as to cover the Cr film, by contrast, is substantially lower than that of the Cr film, about 8%, the defect detecting apparatus would not mistake any part where a TiN film is deposited for an uncorrected defect.

Thus, by depositing over a defective part of a photomask not only a metallic light-shielding film formed to correct the defect but also an antireflective film so as to cover that metallic light-shielding film almost completely, the corrected part of the photomask can be prevented from being mistaken by a defect detecting apparatus for an uncorrected defect.

Incidentally, in a laser CVD process in which a TiN film is formed by using a pulse laser beam source, the film can be formed at a deposition rate of about 0.1 angstrom per pulse though the rate varies with the input concentration, substrate temperature and laser irradiation intensity. Even where the film is to be formed in an extremely small thickness of 400 angstroms or so, the thickness can be accurately controlled by regulating the duration of deposition process with the number of pulses of laser beam irradiation.

Although $Cr(CO)_6$ is used as input gas 32 in the above described embodiment of the present invention, the choice is not restricted to this particular gas, but a mixture of $Cr(CO)_6$ with $W(CO)_6$ or $Mo(CO)_6$ would also provide a film sufficiently shielding light and excelling in adhesion to the substrate.

Furthermore, although a fourth harmonic beam source of a Q-switching Nd:YAG laser is used as laser beam source in this embodiment, the choice is not limited to this particular type, but either a second harmonic beam source or a third harmonic beam source can as well be effectively used for forming an antireflective film over the metallic film. Where a second harmonic beam source is used, inexpensive parts for visible light can be used as optical components of the laser irradiation system. The use of a third harmonic beam source would provide an advantage of, not only the use of less expensive optical components, but also a higher space resolving power for the irradiation pattern than visible light, resulting in a capability for precision control of the edges of the pattern of the film to be deposited.

Next will be described with reference to FIGS. 1 and 4 a defect correcting method in accordance with a second embodiment of the present invention.

In the correcting process according to this embodiment, a light-shielding film is formed so as to cover any defective part of a photomask, and then its reflectance is reduced by oxidizing the surface of this light-shielding film. This makes it possible to prevent, when any defective part is to be detected according to the intensity of the reflected light, any previously defective part corrected by the deposition of the light-shielding film from being mistaken for a still defective part.

The correcting method of the second embodiment of the present invention can be implemented with the apparatus illustrated in FIG. 1. However, unlike the above described correcting method which constitutes the first embodiment, ozone is fed into the chamber 6 from the input gas reservoir 17.

Figure 3:
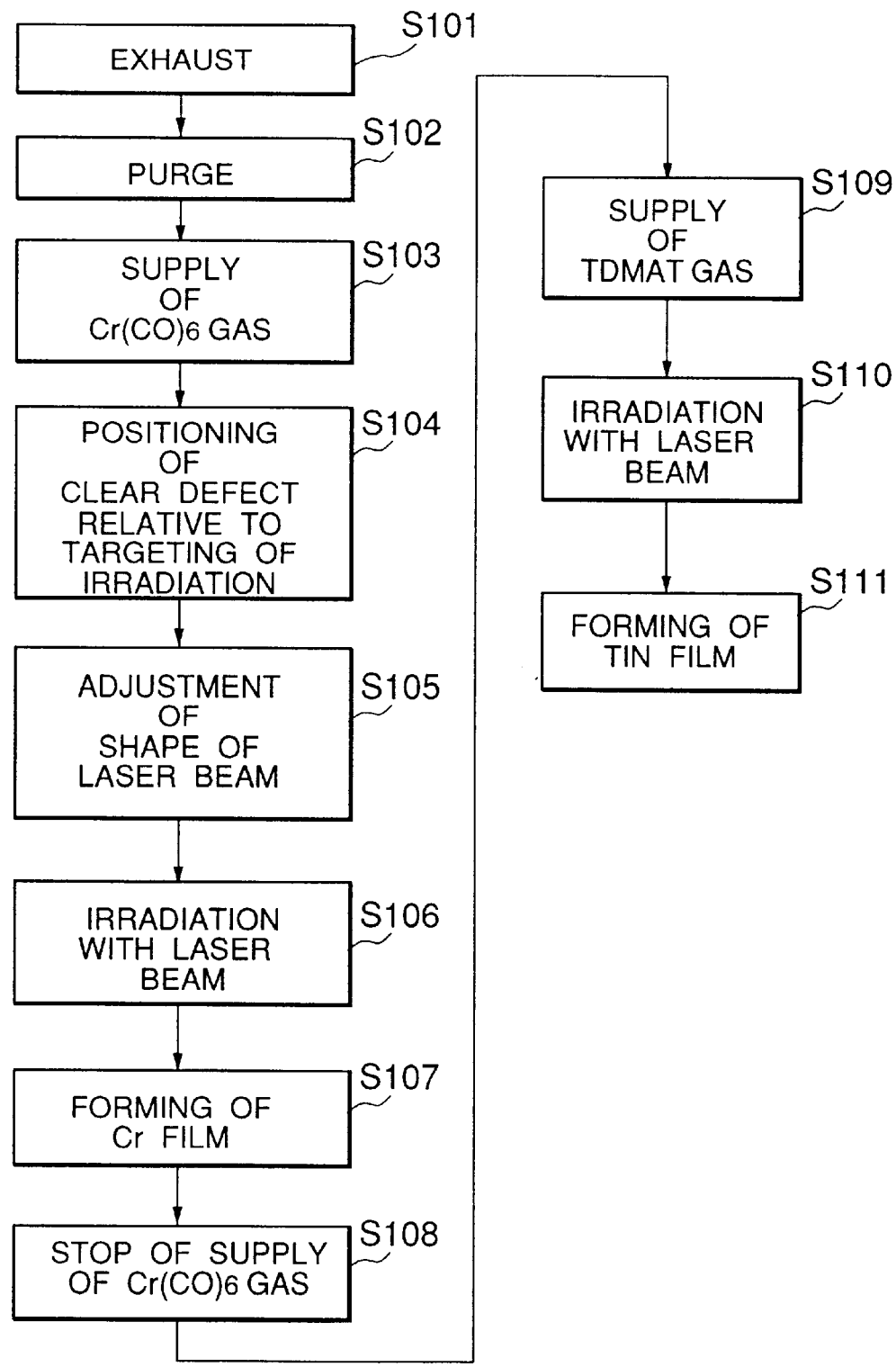
FIG. 3 is a flow chart showing the procedure of correcting defects in a photomask in the first embodiment of the present invention.
Figure 4:
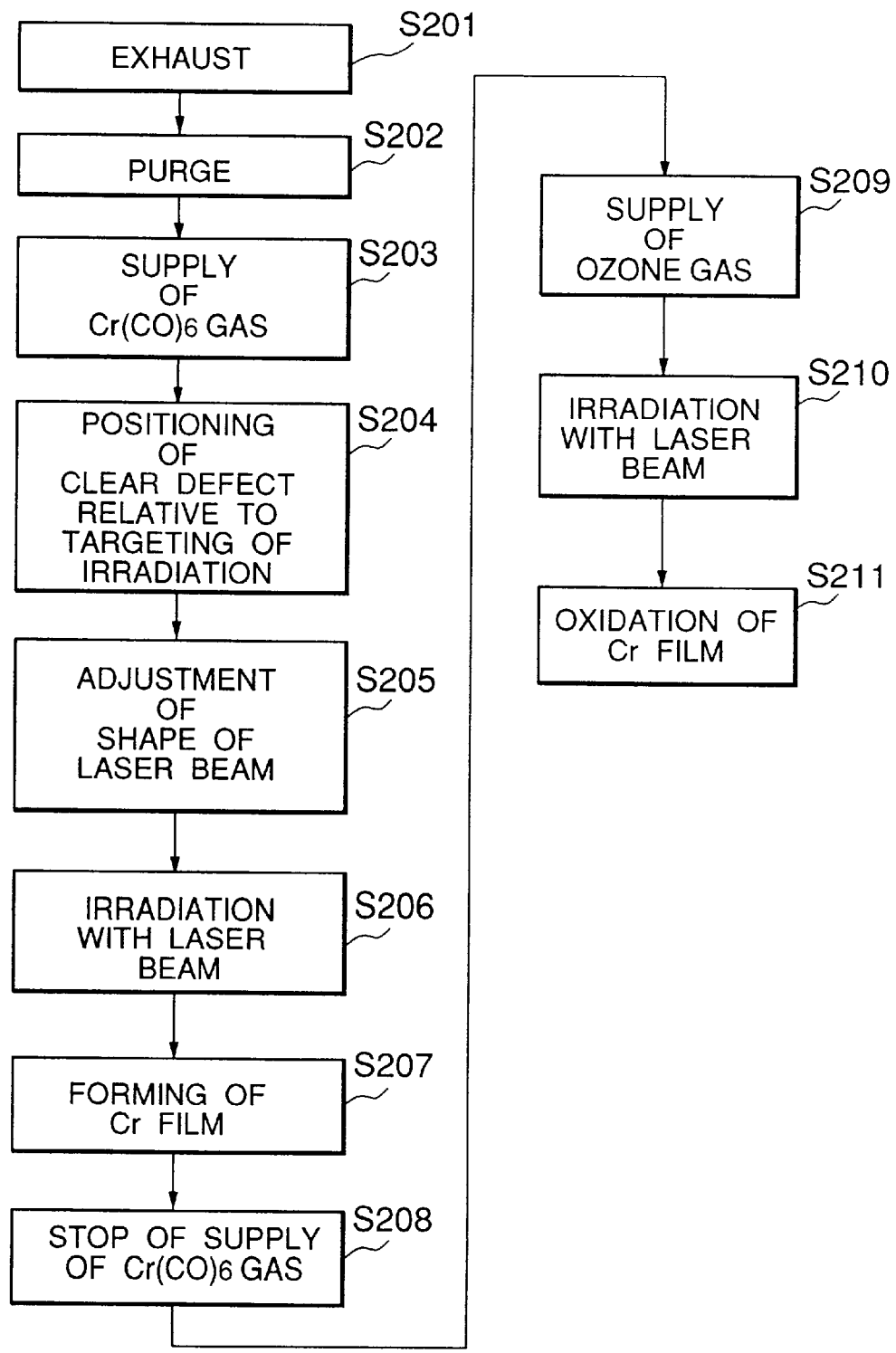
FIG. 4 is a flow chart showing the procedure of correcting defects in a photomask in a second embodiment of the present invention.

In the correcting process according to this embodiment, the steps until the formation of the Cr film, which is a metallic film, so as to cover any defective part of a photomask, i.e. steps from S201 through S207 shown in FIG. 4, are the same as steps S101 through S107 shown in FIG. 3 referred to above. However, since the surface of the Cr film deposited on the substrate 7 is oxidized at a subsequent step, it should desirably be somewhat thicker than that according to the above described first embodiment, preferably 1300 angstroms.

After a Cr film is formed over any clear defect on the substrate 7 and the supply of the input gas $(Cr(CO)_6)$ 32 is stopped (S208), ozone is fed into the chamber 6 (S209) to switch the atmosphere in the chamber to ozone. Then a laser beam emitted from the laser beam source 1 irradiates the already formed Cr film for 50 seconds at an irradiation intensity of 1000 kW/cm$^2$ (S210). This results in the oxidation of the Cr film formed so as to cover the defective part of the photomask (S211).

The reflectance of the Cr film whose surface has been oxidized is approximately 15% or less, considerably lower than that of an unoxidized Cr film. Therefore, a defect detecting apparatus can be prevented from mixtaking any part where a surface-oxidized Cr film is deposited for an uncorrected defect.

It is apparent that the present invention is not limited to the above embodiments but may be modified and changed without departing from the scope and spirit of the present invention.

What is claimed is:

1. A method for correcting any defective part on the surface of a substrate by forming a light-shielding film, comprising the steps of:
    depositing a metallic first film so as to cover a defective part on a surface of a substrate, and
    depositing a second film, whose reflectance is smaller than that of said metallic first film, on said metallic first film so as to cover said metallic first film.

2. A correcting method, as claimed in claim 1, comprising the step of:
    depositing said metallic first film so as to cover said defective part on said substrate by irradiating with a laser beam said defective part on said substrate, arranged in an atmosphere of a first input gas, to decompose said first input gas.

3. A correcting method, as claimed in claim 2, comprising the step of:
    depositing said second film, whose reflectance is smaller than that of said first film, so as to cover said metallic first film by irradiating with a laser beam an area of said substrate, arranged in an atmosphere of a second input gas different from said first input gas, said metallic first film being deposited on said area, to decompose said second input gas.

4. A correcting method, as claimed in claim 3, wherein:
    said second input gas includes tetrakis dimethylamino titanium, and
    said second film includes TiN.

5. A correcting method, as claimed in claim 3, wherein:
    said laser beam is supplied from a harmonic beam source of Q-switching solid laser.

6. A correcting method, as claimed in claim 2, wherein:
    said first input gas includes $Cr(CO)_6$, and said metallic first film includes Cr.

7. A correcting method, as claimed in claim 2, wherein:
    said first input gas is a mixture of $Cr(CO)_6$ and either $W(CO)_6$ or $Mo(CO)_6$.

8. A correcting method, as claimed in claim 1, wherein:
the reflectance of said second film is approximately 8%.

9. A method of correction of a photomask substrate having any clear defect resulting from the loss of part of a light-shielding film arranged in an input gas atmosphere by irradiating said clear defect with a laser beam to form a film over said clear defect by laser CVD, comprising the steps of:

providing a first input gas atmosphere within a vessel in which a photomask substrate having any clear defect resulting from the loss of part of a light-shielding film is arranged by feeding a first input gas into the vessel;

forming a metallic light-shielding film over said clear defect by irradiating with a laser beam said clear defect on said photomask substrate in the atmosphere of the first input gas to decompose said first input gas;

feeding a second input gas into said vessel to switch the atmosphere in said vessel to a second input gas atmosphere; and forming an antireflective film, whose reflectance is smaller than that of said light-shielding film, over said light-shielding film by irradiating with a laser beam an area of said photomask substrate, arranged in the second input gas atmosphere, where said first film is formed, to decompose said second input gas.

10. A correcting method, as claimed in claim 9, wherein:
said first input gas includes $Cr(CO)_6$, and
said first film includes Cr.

11. A correcting method, as claimed in claim 9, wherein:
said first input gas is a mixture of $Cr(CO)_6$ and at least either $W(CO)_6$ or $Mo(CO)_6$.

12. A correcting method, as claimed in claim 9, wherein:
said second input gas includes tetrakis dimethylamino titanium, and
said second film includes TiN.

* * * * *